United States Patent
Kim et al.

(10) Patent No.: US 7,808,011 B2
(45) Date of Patent: Oct. 5, 2010

(54) SEMICONDUCTOR LIGHT EMITTING DEVICES INCLUDING IN-PLANE LIGHT EMITTING LAYERS

(75) Inventors: James C. Kim, San Jose, CA (US); John E. Epler, Milpitas, CA (US); Nathan F. Gardner, Sunnyvale, CA (US); Michael R. Krames, Los Altos, CA (US); Jonathan J. Wierer, Jr., Pleasanton, CA (US)

(73) Assignees: Koninklijke Philips Electronics N.V., Eindhoven (NL); Philips Lumileds Lights Co., LLC, San Jose, CA (US)

(*) Notice: Subject to any disclaimer, the term of this patent is extended or adjusted under 35 U.S.C. 154(b) by 0 days.

(21) Appl. No.: 10/805,424

(22) Filed: Mar. 19, 2004

(65) Prior Publication Data

US 2005/0205884 A1 Sep. 22, 2005

(51) Int. Cl.
H01L 33/00 (2010.01)

(52) U.S. Cl. ............... 257/98; 257/88; 257/89; 257/99

(58) Field of Classification Search ........... 257/88, 257/89, 98, 99
See application file for complete search history.

(56) References Cited

U.S. PATENT DOCUMENTS

| | | | |
|---|---|---|---|
| 3,599,109 A * | 8/1971 | Guggenheim et al. | 372/41 |
| 4,084,130 A | 4/1978 | Holton | |
| 4,240,692 A | 12/1980 | Winston | |
| 4,289,381 A | 9/1981 | Garvin et al. | |
| 5,314,838 A * | 5/1994 | Cho et al. | 438/32 |
| 5,457,530 A * | 10/1995 | Nagai | 356/330 |
| 5,727,108 A | 3/1998 | Hed | |
| 5,805,624 A * | 9/1998 | Yang et al. | 372/45.01 |
| 5,955,749 A | 9/1999 | Joannopoulos et al. | |
| 6,072,197 A | 6/2000 | Horino et al. | |
| 6,122,103 A | 9/2000 | Perkins et al. | |
| 6,257,737 B1 | 7/2001 | Marshall et al. | |
| 6,364,487 B1 | 4/2002 | Weber et al. | |

(Continued)

FOREIGN PATENT DOCUMENTS

WO  WO 01/93387 A2  12/2001

OTHER PUBLICATIONS

Mukaihara et al., "Polarization Control of Vertical-Cavity Surface-Emitting Lasers Using a Birefringent Metal/Dielectric Polarizer Loaded on Top Distributed Bragg Reflector", IEEE Jounral of Selected Topics in Quantum Electronics, vol. 1, No. 2, Jun. 1995, pp. 667-673.*

(Continued)

*Primary Examiner*—Johannes P Mondt

(57) ABSTRACT

A semiconductor light emitting device includes an in-plane active region that emits linearly-polarized light. An in-plane active region may include, for example, a $\{11\bar{2}0\}$ or $\{10\bar{1}0\}$ InGaN light emitting layer. In some embodiments, a polarizer oriented to pass light of a polarization of a majority of light emitted by the active region serves as a contact. In some embodiments, two active regions emitting the same or different colored light are separated by a polarizer oriented to pass light of a polarization of a majority of light emitted by the bottom active region, and to reflect light of a polarization of a majority of light emitted by the top active region. In some embodiments, a polarizer reflects light scattered by a wavelength converting layer.

3 Claims, 5 Drawing Sheets

U.S. PATENT DOCUMENTS

| | | | |
|---|---|---|---|
| 6,520,643 | B1 | 2/2003 | Holman et al. |
| 6,560,265 | B2* | 5/2003 | Hwang et al. ............... 372/96 |
| 6,603,243 | B2 | 8/2003 | Parkyn et al. |
| 6,670,647 | B1* | 12/2003 | Yamasaki et al. ............ 257/99 |
| 6,739,723 | B1* | 5/2004 | Haven et al. ............... 353/20 |
| 7,091,514 | B2* | 8/2006 | Craven et al. ............... 257/14 |
| 2001/0026567 | A1* | 10/2001 | Kaneko et al. ............... 372/43 |
| 2001/0036083 | A1 | 11/2001 | Weber et al. |
| 2002/0004307 | A1 | 1/2002 | Yamada |
| 2002/0030198 | A1* | 3/2002 | Coman et al. ............... 257/103 |
| 2002/0031153 | A1* | 3/2002 | Niwa et al. ............... 372/45 |
| 2002/0084467 | A1 | 7/2002 | Krames et al. |
| 2002/0110172 | A1 | 8/2002 | Hasnain et al. |
| 2002/0140880 | A1 | 10/2002 | Weindorf et al. |
| 2003/0067568 | A1 | 4/2003 | Hamamoto |
| 2003/0214633 | A1 | 11/2003 | Roddy et al. |
| 2003/0235229 | A1 | 12/2003 | Deng et al. |
| 2004/0120379 | A1* | 6/2004 | Kaneko et al. ............... 372/50 |
| 2004/0189167 | A1* | 9/2004 | Adachi et al. ............... 313/112 |

OTHER PUBLICATIONS

Nishiyama et al, IEEE Photonics Technology Letters 10(12), 1676-1678 (Dec. 1998).*
Mukaihara et al., "Polarization control of vertical-cavity surface-emitting lasers by a birefringent metal/semiconductor polarizer terminating a distributed Bragg reflector", in the 14th IEEE International Semiconductor Laser Conference, Maui (HI), USA, Sep. 19-23, 1994; pp. 182-183.*
Uenohara et al., "Investigation of DynamicPolarization Stability of 850-nm GaAs-based Vertical-Cavity Surface-Emitting Lasers Grown on (311)B and (100) Substrates", IEEE Photonics Technology Letters, vol. 11, No. 4, Apr. 1999, pp. 400-402.*
Ser et al, "Polarization stabilization of vertical-cavity top-surface-emitting lasers by inscription of fine metal-interlaced gratings", Applied Physics Letters 66 (21), 2769-2771 (May 22, 1995).*
Sun et al, "Polarization anisotropy of the photoluminescence of M-plane (In,Ga)n/GaN multiple quantum wells", Applied Physics Letters 82(22), 3850-3852 (Jun. 2, 2003).*
European Search Report, 6 pages.
H. De Neve et al., "Recycling of guided mode light emission in planar microcavity light emitting diodes," Apl., Phys. Lett. vol. 70, No. 7, (1997), pp. 799-801.
Response to Final Office Action mailed to USPTO on Sep. 27, 2007, for U.S. Appl. No. 10/804,314, thirteen pages.
Final Office Action mailed on Jun. 28, 2007, for U.S. Appl. No. 10/804,314, nine pages.
Request for Continued Examination (RCE) including Response to Office Action mailed to USPTO on May 14, 2007, for U.S. Appl. No. 10/804,314, fifteen pages.
Final Office Action mailed on Mar. 21, 2007, for U.S. Appl. No. 10/804,314, twenty one pages.
Response to Office Action mailed to USPTO on Nov. 30, 2006, for U.S. Appl. No. 10/804,314, nineteen pages.
Final Office Action mailed on Aug. 22, 2006, for U.S. Appl. No. 10/804,314 seventeen pages.
Interview Summary mailed to USPTO on Aug. 15, 2006, for U.S. Appl. No. 10/804,314 one page.
Final Office Action mailed on Jun. 7, 2006, for U.S. Appl. No. 10/804,314 sixteen pages.
Response to Office Action including Terminal Disclaimer mailed to USPTO on Mar. 15, 2006, for U.S. Appl. No. 10/804,314, fifteen pages.
Non-Final Office Action mailed on Dec. 15, 2005, for U.S. Appl. No. 10/804,314, fifteen pages.
Response to Office Action (Election/Restriction) mailed to USPTO on Oct. 28, 2005, for U.S. Appl. No. 10/804,314, one page.
Non-Final Office Action (Election/Restriction) mailed on Sep. 30, 2005, for U.S. Appl. No. 10/804,314, five pages.
Response to Office Action (Election/Restriction) mailed to USPTO on Aug. 18, 2005, for U.S. Appl. No. 10/804,314, twelve pages.
Non-Final Office Action (Election/Restriction) mailed on Jul. 27, 2005, for U.S. Appl. No. 10/804,314, five pages.
Yue Jun Sun et al., "Polarization anisotropy of the photoluminescence of M-plane (In,Ga)N/GaN multiple quantum wells", Applied Physics Letters, vol. 82, No. 22, Jun. 2, 2003, pp. 3850-3852.
Yue Ju Sun et al., "Nonpolar $In_xGa_{1-x}N/GaN(1100)$ multiple quantum wells grown on $\gamma$-LiAlO2(100) by plasma-assisted molecular-beam epitaxy", Physical Review B 67, 041306(R) (2003), The American Physical Society, 4 pages.

* cited by examiner

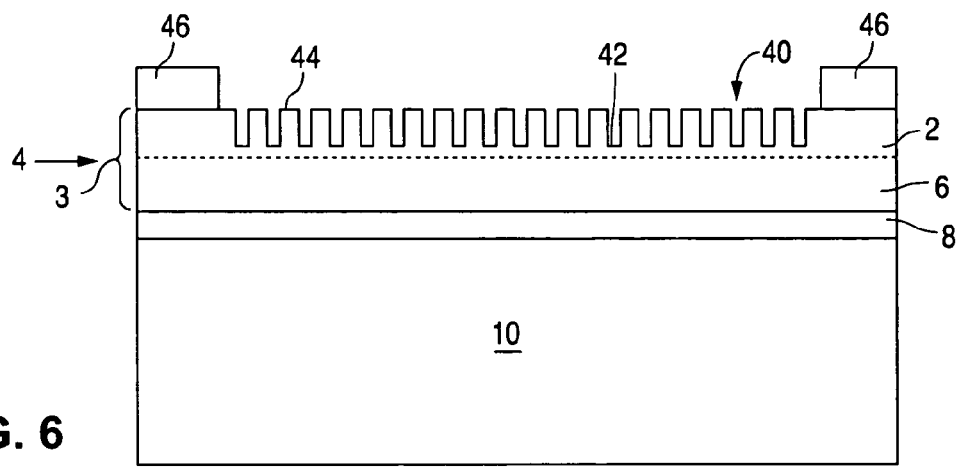
FIG. 6
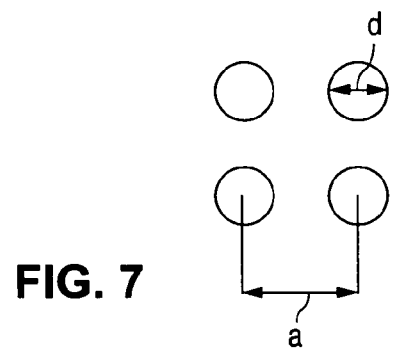
FIG. 7
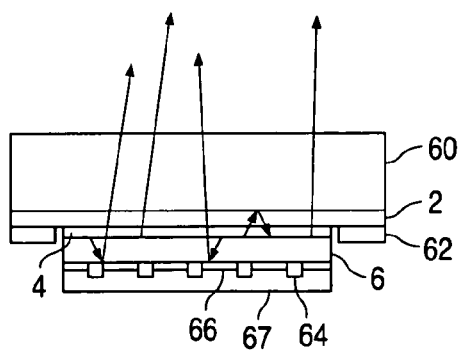        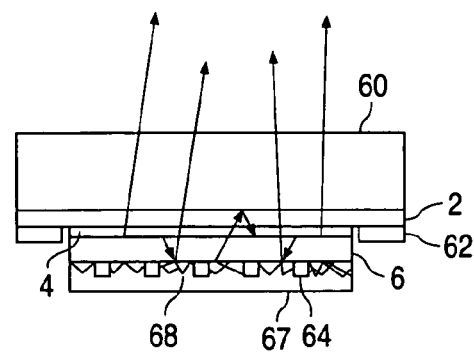
FIG. 9A              FIG. 9B

SEMICONDUCTOR LIGHT EMITTING DEVICES INCLUDING IN-PLANE LIGHT EMITTING LAYERS

BACKGROUND

1. Field of Invention

The present invention relates to semiconductor light emitting devices that emit polarized light.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. One class of UV through green light emitting diodes or short wavelength laser diodes use InGaN/GaN or InGaN/InGaN strained quantum wells to generate light by the recombination of electrons and holes injected from the n- and p-type regions sandwiching the quantum wells.

In many III-nitride devices, the crystal structure is wurtzite with two equivalent crystal axes in the plane of the quantum well and a third crystal axis, the <0001> axis, perpendicular to the quantum well. Light emitted from such devices is observed to have no net polarization, meaning that any point (atom, molecule, or electron-hole pair) in the active region of such devices is observed to emit light with a polarization direction randomly and very quickly (typically less than 10 nanoseconds) changing in time so that no net polarization is observed over longer time scales. Such conventional structures are said to emit randomly polarized light.

SUMMARY

In accordance with embodiments of the invention, a semiconductor light emitting device includes a planar active region with a wurtzite crystal structure having a <0001> axis roughly parallel to the plane of the layer, referred to as an in-plane polarized active region. The in-plane polarized active region may include, for example, a $\{11\bar{2}0\}$ or $\{10\bar{1}0\}$ InGaN light emitting layer. The emitted light polarization direction is both perpendicular to the <0001> axis and parallel to the quantum well, thus much of the emitted light is of a single linear polarization state. In some embodiments, a wire-grid contact serves as a polarizer oriented to transmit or reflect light of a polarization of the majority of light emitted from the active region. In some embodiments, two active regions emitting the same or different colored light are separated by a polarizer oriented to pass polarized light emitted by the bottom active region, and to reflect cross-polarized light emitted by the top active region. In some embodiments, a polarizer reflects light scattered by a wavelength converting layer.

BRIEF DESCRIPTION OF THE DRAWINGS

FIG. 6 is a cross sectional view of a photonic crystal device including an in-plane polarized active region.

FIG. 7 is a plan view of a square lattice photonic crystal.

FIG. 9A illustrates a device including a polarization rotating layer and an in-plane active region. FIG. 9B illustrates a device including a polarization randomizing layer and an in-plane active region.

DETAILED DESCRIPTION

Figure 1:
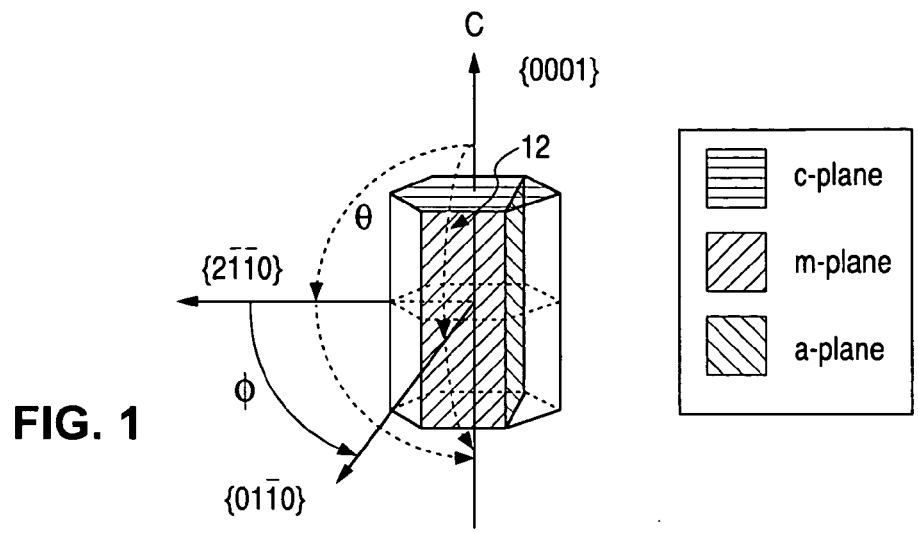
FIG. 1 illustrates the crystal structure of a wurtzite III-nitride semiconductor.

FIG. 1 illustrates a wurtzite crystal GaN structure. III-nitride devices are often grown on the {0001} or c-plane of a sapphire substrate, due to the wide availability and ease of handling such substrates. The resulting III-nitride layers, including the light emitting layer or layers in the active region, are typically {0001} layers, meaning the <0001> axis is perpendicular to the plane of the III-nitride layers. Light emitted by such active regions typically shows no polarization preference when measured externally to the crystal.

In accordance with embodiments of the invention, a III-nitride light emitting device is grown such that the crystallographic <0001> direction is roughly parallel to the plane of the light emitting III-nitride layers. Light emitted by such devices may be at least partially linearly polarized. A device or crystal layer with the <0001> direction parallel to the plane of the layer or layers is referred to below as an "in-plane" or "in-plane polarized" device or layer, since the c-axis is parallel to or in the plane of the device layers. In some embodiments, the light emitting layer or layers in the active region of a III-nitride device are $<10\bar{1}0>$ or $<11\bar{2}0>$ layers of the quaternary alloy $In_xAl_yGa_{1-x-y}N$ ($0 \leq x \leq 1$, $0 \leq y \leq 1$, $x+y \leq 1$).

Devices with in-plane light emitting layers may be fabricated by growing the device layers on an in-plane growth substrate. Examples of substrates suitable for growth of an in-plane active region include the $\{10\bar{1}0\}$ and $\{11\bar{2}0\}$ surfaces of SiC of the 2H, 4H, or 6H polytypes; the $\{10\bar{1}2\}$ surface of sapphire; and the $\{100\}$ surface of $\gamma$-LiAlO$_2$. In the case of SiC substrates, the orientation of the deposited III-nitride films matches the orientation of the substrate. When using the metal-organic chemical vapor-phase epitaxy technique, the process of depositing the in-plane III-nitride layers is similar to the process used for depositing <0001> III-nitride layers on a <0001> SiC substrate. A buffer layer of AlGaN is deposited, at high temperature (~1100° C.), directly on the SiC substrate. A layer of GaN is deposited on the AlGaN buffer layer. Light-emitting AlInGaN quantum wells are deposited on the GaN layer.

In the case of a sapphire substrate with a $\{10\bar{1}2\}$ surface, the deposited III-nitride films are oriented in the $<11\bar{2}0>$ direction. When using the metal-organic chemical vapor-phase epitaxy technique, the process of depositing in-plane III-nitride layers is similar to the process used for depositing <0001> III-nitride layers on a <0001> sapphire substrate. A III-nitride buffer layer is deposited, at low temperature (~550° C.), directly on the sapphire substrate. A layer of GaN is deposited on the III-nitride buffer layer. Light emitting AlInGaN quantum wells are deposited on the GaN layer.

In the case of a <100> γ-LiAlO$_2$ substrate, the deposited III-nitride films are oriented in the <10$\bar{1}$0> direction. The process for depositing in-plane III-nitride layers by molecular beam epitaxy consists of depositing a III-nitride buffer layer at low temperature (~550° C.) directly on the substrate, followed by a layer of GaN grown at a higher temperature. The light-emitting AlInGaN quantum wells are deposited on the GaN layer.

The inventors prepared III-nitride photoluminescence test structures grown on {10$\bar{1}$0} SiC and {10$\bar{1}$2} sapphire. When the test structures were excited by a 396 nm laser to emit light at 475 nm, the light from the {10$\bar{1}$0} SiC device was had a polarization ratio greater than about 90%, and the light from the {10$\bar{1}$2} sapphire device had a polarization ratio of about 80%. When the test structures were electrically excited, the light from the {10$\bar{1}$0} SiC device had a polarization ratio of 70-80%. Polarization ratio is defined as:

$$\frac{|I_p - I_s|}{I_p + I_s} \times 100\%$$

where $I_p$ and $I_s$ are the intensities of vertically and horizontally polarized light. Embodiments of the present invention may include devices that emit light having a polarization ratio of at least 50%. Unpolarized light consists of a very large number of photon emissions from a very large number of individual atoms, molecules, or electron-hole pairs. Each photon will have a random but a definite polarization direction and a train of such photons will be emitted at a very high rate, possibly greater than 100 million per second. For unpolarized light, the sum total of the polarizations of every atom, molecule or electron-hole pair will sum up to zero when sampled over a time scale much larger than 1/100 millionth second. Unpolarized light thus has a polarization ratio of 0%.

Figure 8:
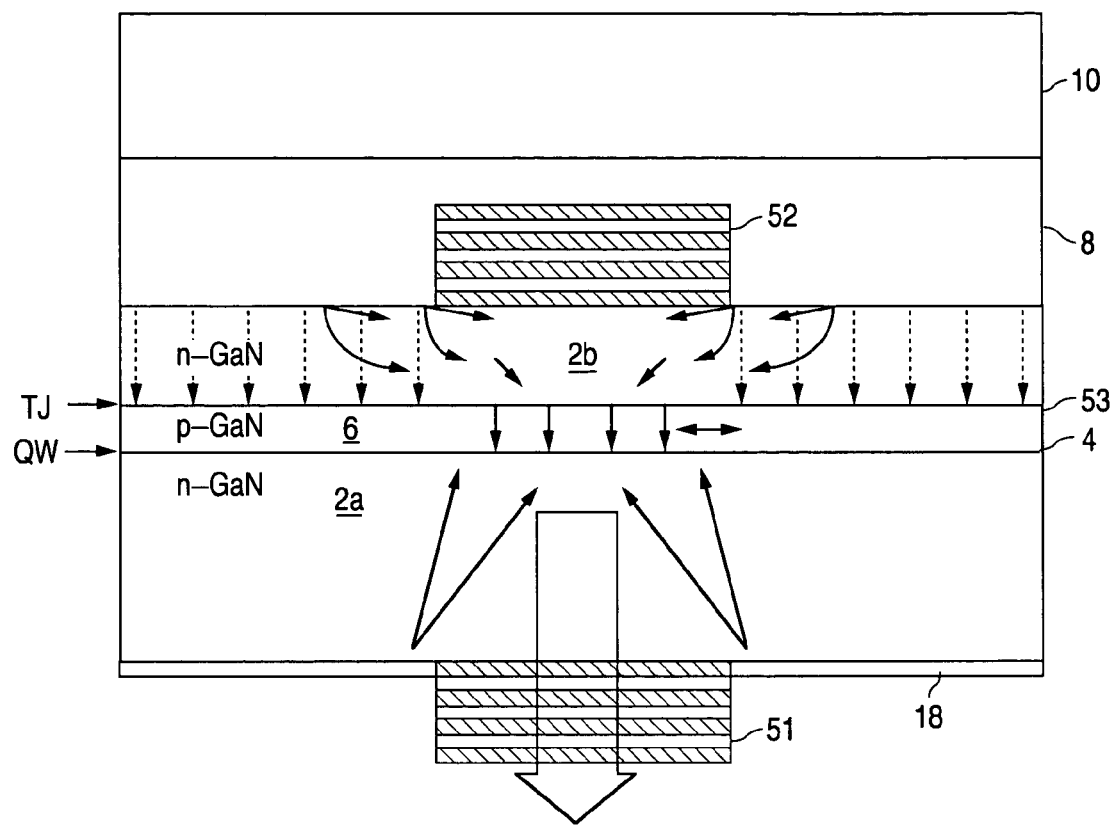
FIG. 8 is a cross sectional view of a vertical cavity surface emitting laser including an in-plane active region.
Figure 10:
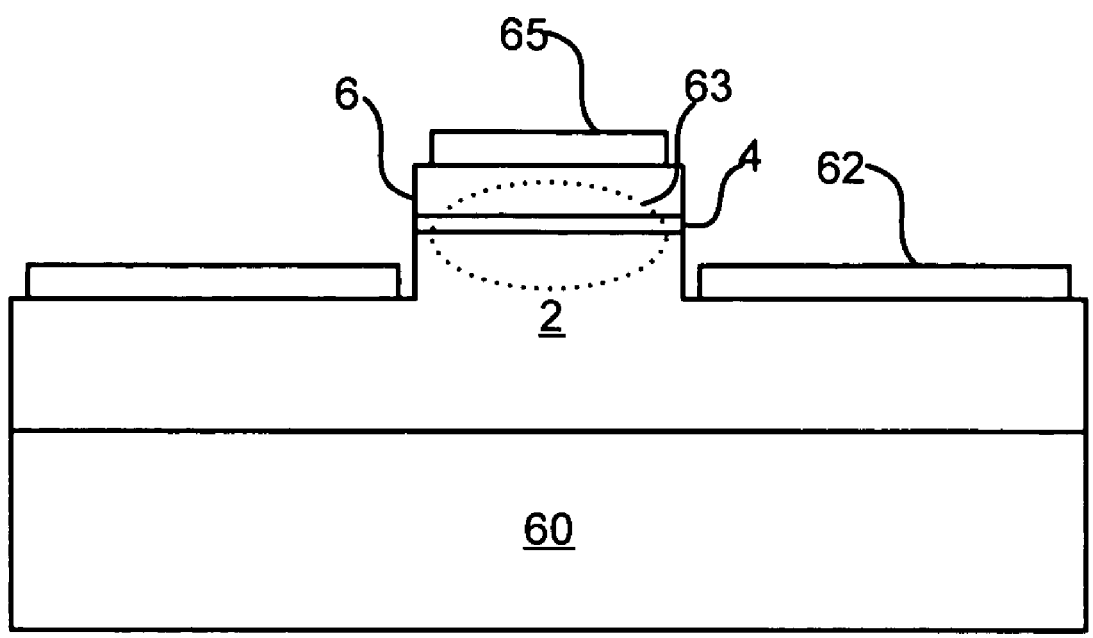
FIG. 10 illustrates an edge-emitting laser including an in-plane active region.

The embodiments described below take advantage of the linearly polarized light emitted from in-plane light emitting layers. FIGS. 2-5 illustrate devices that combine an in-plane active region with a polarizer which may act as a transparent or reflective electrical contact, depending on the orientation of the polarizer relative to the polarization of light emitted by the active region. FIGS. 6 and 7 illustrate a photonic crystal device incorporating an in-plane active region. FIGS. 8 and 10 illustrate a vertical cavity surface emitting laser and an edge-emitting laser incorporating an in-plane active region. FIGS. 9A and 9B illustrate devices including an in-plane active region and a polarization-shifting surface such as a scattering surface or a birefringent layer.

Figure 2:
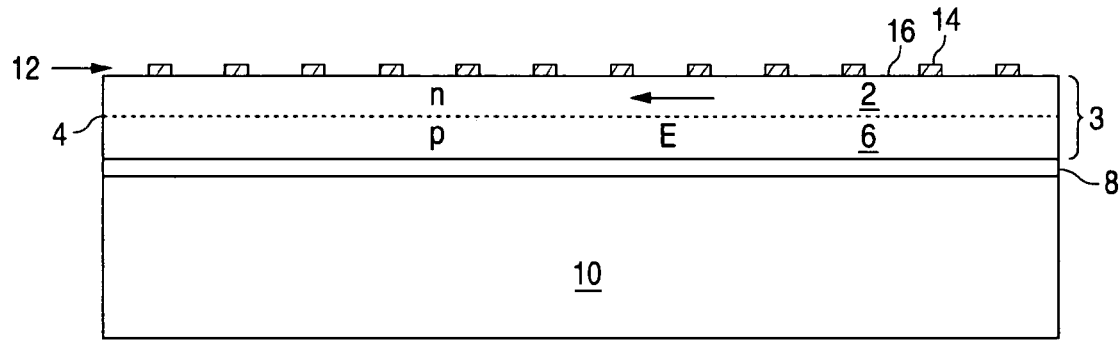
FIG. 2 is a cross sectional view of a device including an in-plane polarized active region and a polarizer.
Figure 3:
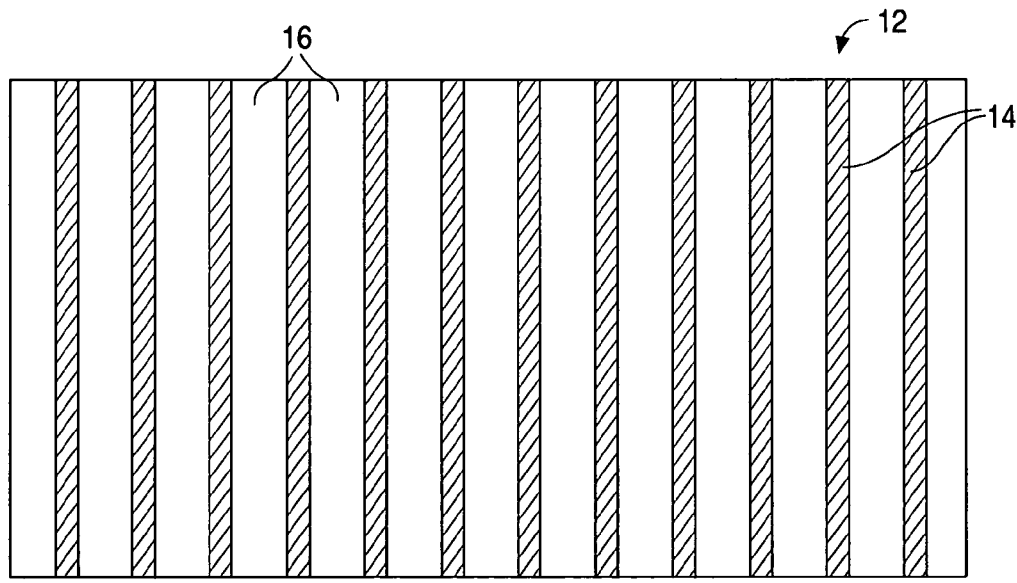
FIG. 3 is a plan view of the device of FIG. 2.

FIGS. 2 and 3 are a cross-sectional view and a plan view of a first embodiment of the invention including an in-plane light emitting layer and a polarizer. In-plane active region 4 is sandwiched between an n-type region 2 and a p-type region 6. Each of n-type region 2, active region 4, and p-type region 6 may include multiple layers of different composition, dopant concentration, and thickness. Active region 4 may include multiple quantum wells separated by barrier layers. A reflective contact 8 attaches epitaxial regions 2, 4, and 6 to a host substrate 10. Contact 8 may include, for example, an ohmic contact layer, a reflective layer such as silver, a guard layer, and bonding layers to bond the epitaxial structure to the host substrate. Light is extracted from the device through n-type region 2.

A polarizer 12 is formed on n-type region 2. The polarizer illustrated in FIG. 2 is a wire grid polarizer. Wire grid polarizers reflect photons of a polarization that is parallel to the wires, and transmit photons of a polarization that is perpendicular to the wires. Polarizer 12 is oriented to transmit photons of the polarization emitted by active region 4, and to reflect any photons of opposite polarization. The periodicity of wires in a wire grid polarizer may be optimized for the wavelength of emission of the device, resulting in high reflecting efficiency. The spacing and thickness of the wires may depend on the wavelength of light emitted by the device. The wires may be between about 10 nm and about 1000 nm thick and are usually between about 50 nm and about 80 nm thick. The wires may be spaced between about 10 nm and about 1000 nm apart and are usually between about 100 nm and about 200 nm apart. The wires may be, for example, single or multi-layer metal structures including, for example, one or more of an ohmic layer, a reflective layer, a guard layer, and a bonding layer. Examples of suitable materials include silver, aluminum, gold, and rhodium. Commercially available wire grid polarizers of dimensions within the ranges described above have been shown to have polarization selectivity to light with wavelengths over the range of 400-600 nm. The proper orientation of the wire grid polarizer may be selected based on the construction of the device, or by measuring the polarization of light emitted by the device.

In the embodiment illustrated in FIG. 2, wire grid polarizer 12 serves as a contact to n-type region 2. The contact may be completed by forming pads electrically connected to wire grid polarizer 12 that are suitable for bonding to, for example, a submount or wire bonds. Using a polarizer oriented to pass light of the polarization emitted by the active region results in a contact that is transparent to the light emitted by the active region, reducing any absorption of light by the contact that would decrease the extraction efficiency of the device. In some embodiments, a current spreading layer such as indium tin oxide may be disposed between the semiconductor layer (n-type region 2 in FIG. 2) and the polarizer.

In other embodiments, a wire grid polarizer may serve as a contact to p-type region 6. In such embodiments, the wire grid polarizer permits the use of thin epitaxial layers in the device. For example, the total thickness of regions 2, 4, and 6 may be between about 0.1 and about 1 micron thick. Thinning the epitaxial structure enhances light extraction from the device. As the thickness of the epitaxial structure decreases, the current spreading distance in p-type region 6 decreases, requiring a p-contact covering a large area, or requiring a closely-spaced grid or finger p-contact. If the p-contact absorbs light, the large area or closely spaced fingers required in a thin device may absorb a significant amount of light, reducing the efficiency of the device. The use of an in-plane polarized active region and a wire grid polarizer as a p-contact results in a device having a contact with fingers close enough to provide sufficient current to the device, but transparent to light emitted by the active region. Accordingly, in-plane active regions may permit thinner devices to be made without sacrificing light extraction.

The device illustrated in FIG. 2 is fabricated by growing epitaxial regions 2, 4, and 6 on a growth substrate, depositing contact 8, then bonding the epitaxial structure to host substrate 10. The growth substrate may then be removed, for example by laser lift-off in the case of a sapphire substrate, or by etching in the case of a SiC substrate. After growth substrate removal, the epitaxial structure may be thinned to a desired thickness. The fabrication of III-nitride devices by substrate removal is described in more detail in application Ser. No. 10/804,810, filed Mar. 19, 2004, and incorporated herein by reference.

Polarizer 12 is often formed as the last processing step, prior to singulating the dice from the host substrate wafer. A wire grid polarizer may be formed by the following method: a layer of metal is deposited on the wafer, then patterned by, for example, depositing a layer of photoresist over the metal then patterning the photoresist by exposing it to radiation, for example by shining short-wavelength light through a photomask with the wire-grid polarizer pattern already formed on it, by using the interference pattern from two laser beams to project an array of lines of light of varying intensity onto the photoresist, or by drawing the wire-grid polarizer pattern on the photoresist with an electron beam. Once the photoresist is exposed, it is developed and rinsed, resulting in lines of photoresist remaining on the metal layer. As an alternative to photoresist, the wire grid polarizer pattern may be imprinted into a polymer layer with a master stamp containing the inverse of the desired pattern. The exposed metal layer is etched by chemicals (wet etching), a reactive ion beam (RIE), a plasma-enhanced reactive ion beam, an inductively-coupled plasma (ICP), or other appropriate technique known in the art. The remaining photoresist or polymer may then be chemically stripped from the wafer, resulting in a pattern of parallel, evenly spaced metal lines 14 on the wafer, separated by spaces 16, as illustrated in FIG. 3.

Figure 4:
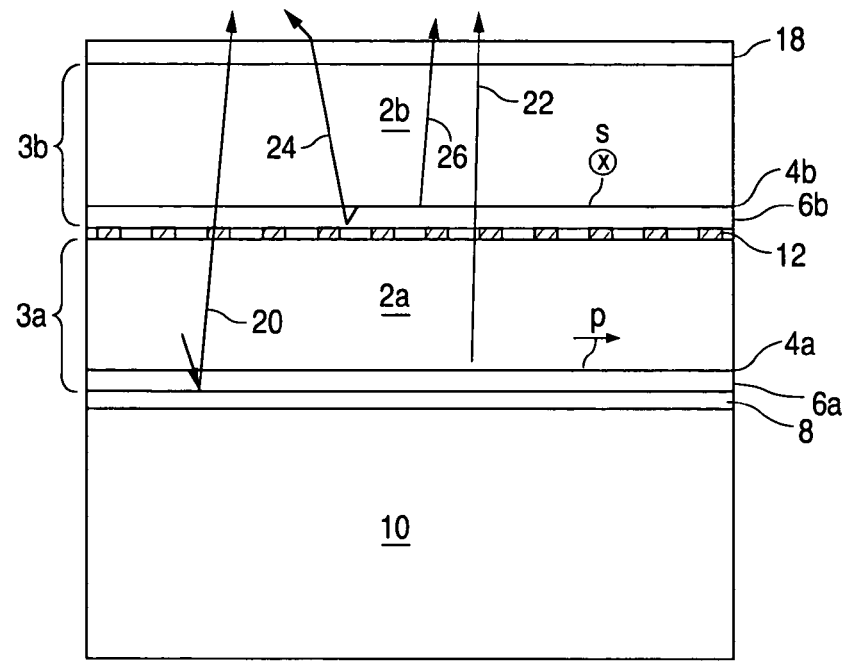
FIG. 4 is a cross sectional view of a device including two light emitting diodes separated by a wire-grid polarizer.

FIG. 4 illustrates a second embodiment of the invention including an in-plane light emitting layer and a polarizer. Two epitaxial structures 3a and 3b are stacked and separated by polarizer 12, which may serve as an electrical contact and bonding layer between epitaxial structures 3a and 3b. Polarizer 12 may be a wire grid polarizer. The two active regions 4a and 4b emit light of orthogonal polarization. The bottom epitaxial structure 3a is bonded to a host substrate 10 by reflective contact 8. Light from both active regions is extracted from the device through the top of the n-type region 2b of the second epitaxial structure 3b. The structure and orientation of polarizer 12 is selected such that the polarized light emitted from the bottom active region 4a is transmitted, while the polarized light emitted from the top active region 4b is reflected.

Light rays 20, 22, 24, and 26 demonstrate the behavior of the device of FIG. 4. Active region 4a primarily emits photons of polarization p. Active region 4b primarily emits photons of polarization s. Polarizer 12 transmits photons of polarization p and reflects photons of polarization s. Light ray 20 is emitted by active region 4a downward, toward contact 8. Light ray 20 is reflected by contact 8 and is incident on polarizer 12. Since light ray 20 has polarization p, it is transmitted by polarizer 12 and escapes through the top surface of the device. Light ray 22 is emitted by active region 4a toward polarizer 12, is transmitted by polarizer 12 since it is p-polarized, and escapes through the top surface of the device. Light ray 24 is emitted by active region 4b downward, toward polarizer 12. Since light ray 24 is s-polarized, it is reflected by polarizer 12 and escapes through the top surface of the device. Light ray 26 is emitted by active region 4b toward the top surface of the device, where it escapes. Polarizer 12 thus prevents light emitted downward by the top epitaxial structure 3b from being absorbed by bottom epitaxial structure 3a. Since light emitted by active region 4a has a polarization orthogonal to light emitted by active region 4b, active region 4b will not absorb the light from active region 4a passing through epitaxial structure 3b. For a given device footprint, the device illustrated in FIG. 4 may offer increased light output over a device with a single active region. In some embodiments, the two active regions 4a and 4b may emit light of different wavelength. The wavelengths may be chosen such that the combined light emitted by the device appears white. In some embodiments, the two epitaxial structures 3a and 3b may be formed from different materials systems, increasing the range of wavelengths available.

The device illustrated in FIG. 4 may be fabricated by growing n-type region 2a, active region 4a, and p-type region 6a on a growth substrate, then forming contact 8, which may include, for example, ohmic contact layers, reflective layers, barrier layers, and bonding layers, on the surface of p-type region 6a. Epitaxial structure 3a is then bonded to host substrate 10 and the growth substrate is removed. Polarizer 12 is then formed on the surface of n-type region 2a exposed by growth substrate removal. Polarizer 12 may serve as the electrical contact and bonding layer between epitaxial structure 3a and epitaxial structure 3b, or a separate metal or highly conductive layer may be formed on the surface of n-type region 2a to serve as a bonding layer and electrical contact between epitaxial structures 3a and 3b. Polarizer 12 may be formed from a soft metal suitable for bonding, such as silver. The second epitaxial structure is formed by growing n-type region 2b, active region 4b, and p-type region 6b on a growth substrate, then bonding the epitaxial structure to polarizer 12 such that the surface of p-type region 6b faces polarizer 12. The second growth substrate may then be removed and a second contact 18 formed on the exposed surface of n-type region 2b. Though the embodiment illustrated in FIG. 4 shows two diodes connected in series, other electrical arrangements, such as two diodes connected in parallel, are possible.

Figure 5:
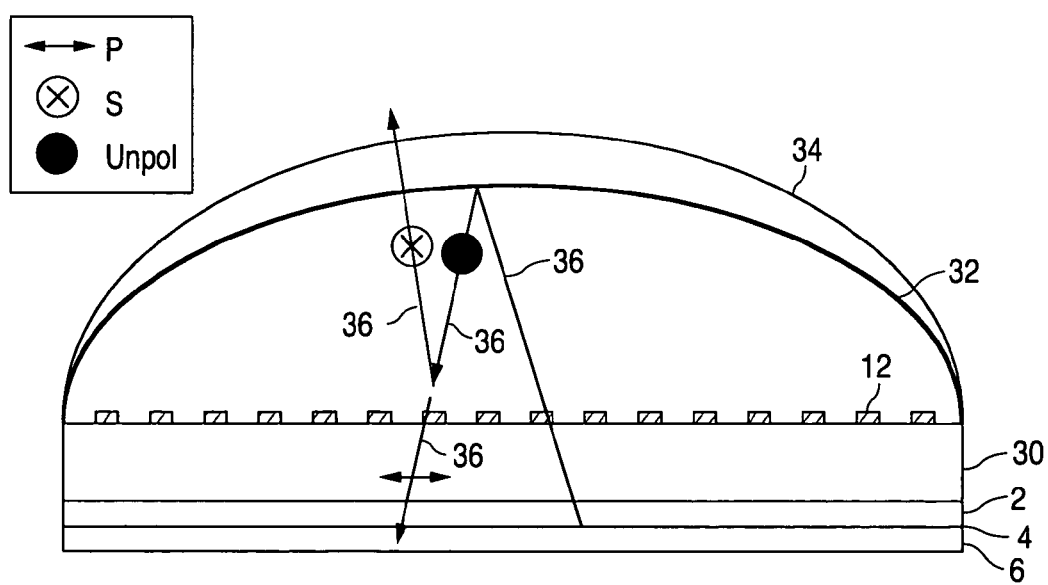
FIG. 5 is a cross sectional view of a device including an in-plane polarized active region, a polarizer, and a wavelength converting layer.

FIG. 5 illustrates a third embodiment of the invention including an in-plane light emitting layer and a polarizer. N-type region 2, in-plane active region 4, and p-type region 6 are grown on a growth substrate 30. N- and p-contacts (not shown) are both formed on the side of the epitaxial structure opposite the growth substrate, the n-contact by etching away a portion of active region 4 and p-type region 6 to expose a portion of n-type region 2. Light is extracted from the device though growth substrate 30. A polarizer 12, for example a wire grid polarizer, is formed on the surface of growth substrate 30. Polarizer 12 is structured and oriented to transmit light of the polarization emitted by active region 4 and reflect light of the opposite polarization. A wavelength converting material 32 is disposed in the path of light emitted from the device. Wavelength converting material 32 may be conformally deposited on substrate 30, for example by stenciling or electrophoretic deposition, disposed in a fill material deposited over substrate 30, or coated on a surface of or within the material forming a lens or cover 34 over the epitaxial structure.

Wavelength converting material 32 may be a fluorescent material such as a phosphor or dye that absorbs light emitted by the active region and reemits light of a different wavelength. Wavelength converting material 32 emits light in all directions, meaning that a significant fraction of light emitted by wavelength converting material 32 is emitted towards growth substrate 30. Light emitted by wavelength converting material 32 is unpolarized. Accordingly, half of the fraction of light emitted by wavelength converting material 32 toward substrate 30 will be transmitted by polarizer 12 and half will be reflected. In contrast, in conventional devices, most of the light emitted toward the substrate is absorbed by growth substrate 30 or the epitaxial structure 3, reducing the extraction efficiency of the device. Light ray 36 illustrates this behavior. Light 36 is emitted from active region 6 with a polarization that is transmitted by polarizer 12. Light 36 is incident on wavelength converting layer 32, where it is absorbed and emitted toward substrate 30 as unpolarized, wavelength-converted light. When light 36 is incident on polarizer 12, a portion is reflected back toward wavelength converting layer 32, where it has another chance to exit the device. A portion is transmitted into the growth substrate 30, where it may be absorbed or reflected such that is has another chance to escape the device.

Though the device illustrated in FIG. 5 is a flip chip device that retains the growth substrate, other types of devices, including a thin device with the growth substrate removed as illustrated in FIG. 2, may combine a polarizer and a wavelength converting layer.

FIG. 6 is a cross sectional view of a device including a photonic crystal and an in-plane active region. Photonic crystal 40 is created by forming a lattice of holes 42 separated by mesas 44 in n-type region 2 of the epitaxial structure 3. The lattice of holes creates a medium with a periodically modulated dielectric constant, affecting the way light propagates through the medium. The photons of the light emitting diode can be characterized by their spectrum or dispersion relation, describing the relation between the energy and the wavelength of the photons. The relationship may be plotted, yielding a photonic band diagram consisting of energy bands, or photonic bands, separated by band gaps. Though the photonic band diagram is similar to the spectrum of electrons in crystalline lattices as expressed in an electronic band diagram, the photonic band diagram is unrelated to the electronic band diagram. When a photonic crystal is formed into a III-nitride LED it affects how light propagates in the structure. Therefore if the proper lattice spacing is chosen, light that would otherwise have been trapped in the structure by total internal reflection can now escape, increasing the extraction of the LED. Also, alternative lattices can reduce the photon mode volume in the LED structure increasing the radiative rate or internal efficiency of the LED active layer.

N-contact 46 may be formed on a region of n-type region 2 that is not textured with the photonic crystal, though in other embodiments n-contact 46 may be formed on the photonic crystal area of n-type region 2. Since the photonic crystal is formed in an n-type region, the n-type material (highly conductive) is able to laterally inject current from contact 46 to photonic crystal 40. Light is extracted from the device through photonic crystal 40, thus the arrangement of n-contact 46 is selected to maximize the area of the photonic crystal. For example, n-contact 46 may surround photonic crystal region 40. N-contact 46 is not limited to a ring contact but could also be a grid or other structure that facilitates proper current spreading. To avoid light being absorbed by the n-contact 46, implantation can be used on the epitaxial material under n-contact 46, preventing current flow and light generation in that area. A reflective p-contact 8 is formed on p-type region 6. P-contact 8 connects the epitaxial structure 3 to a host substrate 10 either directly or via optional bonding layers. An optional contact (not shown) may be formed on the surface of host substrate 10 opposite the epitaxial structure 3.

The photonic crystal structure can include a periodic variation of the thickness of n-type region 2, with alternating maxima and minima. An example is a grating (one-dimensional lattice) or the planar lattice of holes 42 described above (two-dimensional lattice). The lattice is characterized by the diameter of the holes, d, the lattice constant a, which measures the distance between the centers of nearest neighbor holes, the depth of the holes w, and the dielectric constant of the dielectric, disposed in the holes, $\epsilon_h$. Parameters a, d, w, and $\epsilon_h$ influence the density of states of the bands, and in particular, the density of states at the band edges of the photonic crystal's spectrum. Parameters a, d, w, and $\epsilon_h$ thus influence the radiation pattern emitted by the device, and can be selected to enhance the extraction efficiency from the device.

Holes 42 can be arranged to form triangular, square, hexagonal, honeycomb, or other well-known two-dimensional lattice types. In some embodiments, different lattice types are formed in different regions of the device. Holes 42 can have circular, square, hexagonal, or other cross sections. In some embodiments, the lattice spacing a is between about $0.1\lambda$ and about $10\lambda$, preferably between about $0.1\lambda$ and about $4\lambda$, where $\lambda$ is the wavelength in the device of light emitted by the active region. In some embodiments, holes 42 may have a diameter d between about 0.1 a and about 0.5 a, where a is the lattice constant. Holes 42 can be filled with air or with an optional dielectric (not shown) of dielectric constant $\epsilon_h$, often between about 1 and about 16. Possible dielectrics include silicon oxides.

The use of an in-plane active region may simplify the structure of photonic crystal 40. Conventional active regions emit light of all polarizations, necessitating a photonic crystal structure that has band gaps for all polarizations of light. The use of an in-plane active region emitting polarized light may permit the use of a much simpler lattice, since it is no longer necessary to control polarizations of light other than the polarization of light emitted from the active region. Accordingly, to achieve the same device performance, a simple line grating or square lattice may be all that is required for an in-plane active region device, instead of a triangular or hexagonal lattice that is difficult to fabricate.

In some embodiments, photonic crystal 40 is formed on a device with a thin epitaxial structure. The thinner the cavity, the fewer the waveguided modes, meaning that as the thickness decreases, more light is emitted from the device. The thickness of the epitaxial structure 3 is selected such that the epitaxial layers are as thin as possible to reduce the number of waveguided modes, but thick enough to efficiently spread current. In many embodiments, the thickness of epitaxial structure 3 is less than about 1 μm.

In some embodiments, the thickness of epitaxial structure 3 is between about $\lambda$ and about $5\lambda$, between about 0.18 μm and about 0.94 μm for a device that emits 450 nm light. Holes 42 have a depth between about $0.05\lambda$ and the entire thickness of n-type region 2. Generally, holes 42 are formed entirely within n-type region 2 and do not penetrate into the active region. N-type region 2 usually has a thickness of about 0.1 microns or more. In general, the depth of holes 42 is selected to place the bottoms of holes 42 as close to the active region as possible without penetrating the active region.

The radiation pattern emitted from the device can be tuned by changing the lattice type, distance between the active region and the photonic crystal, lattice parameter a, diameter d, and depth w. The lattice parameter a and diameter d are illustrated in the square lattice shown in FIG. 7. In some embodiments, the radiation pattern may be adjusted to emit light preferentially in a chosen direction.

In the device illustrated in FIG. 6, photonic crystal 40 is entirely contained within n-type region 2. In other embodiments, photonic crystal 40 may be formed in p-type region 6, or may extend from either p-type region 6 or n-type region 2 into or through active region 4. In such embodiments, the simplified photonic crystal structure that may be possible with an in-plane active region may further improve the performance of the device by limiting the amount of active region that is etched away to form the photonic crystal, and by limiting the amount of etching done in the p-type region, which may damage the crystal and reduce device performance. Though FIG. 6 shows photonic crystal 40 on the surface of the device, in other embodiments, photonic crystal 40 may be formed in a region of the device that is not on the surface. In such embodiments, a buried photonic crystal may be formed on one side of the active region, and a contact that acts as a polarizer, such as in the device illustrated in FIG. 2, may be formed on the opposite side of the active region on the surface of the device.

III-nitride photonic crystal light emitting devices are described in more detail in application Ser. No. 10/059,588, "LED Efficiency Using Photonic Crystal Structure," filed Jan. 28, 2002 and application Ser. No. 12/259,120, filed Mar. 19, 2004, both of which are incorporated herein by reference.

FIG. 8 is a cross sectional view of a vertical cavity surface emitting laser (VCSEL) incorporating an in-plane active region. Active region 4 is sandwiched between p-type region 6 and a first n-type region 2a. A tunnel junction 53 separates p-type region 6 from a second n-type region 2b. The cavity is formed by two mirrors 51 and 52, which may be, for example, dielectric distributed Bragg reflectors (DBRs). The cavity is connected to a host substrate 10 by contact 8, which is disposed between n-type region 2b and host 10. A second contact 18 is formed on n-type region 2a. Portions of layers 2a, 2b, 4, and 6 may be implanted with hydrogen to confine current within the region between mirrors 51 and 52.

VCSELs require an adequate population inversion to provide an optical gain greater than the optical loss for the lasing mode. Any recombination process other than stimulated emission into the desired cavity modes tends to deplete the population inversion and limit efficiency. In the case of a very short cavity typical of VCSELs an example of an undesired mode is the mode that is degenerate but orthogonally polarized to the desired lasing mode. An in-plane active layer that emits light in a single polarization when operating below the lasing threshold will not support the orthogonally polarized mode, and will thus require fewer injected carriers to reach the lasing threshold. In addition, a VCSEL incorporating an in-plane active region may not exhibit polarization "flips" which are problematic for many applications such as displays that require light of a particular polarization.

In order to form a VCSEL, mirrors 51 and 52 must be highly reflective, i.e. greater than 99% reflective. In some embodiments, the device of FIG. 8 may be a resonant cavity device where one or both mirrors are less reflective than required for a VCSEL. Since the mirrors need not be as reflective for a resonant cavity device as for a VCSEL, in a resonant cavity device, the DBR shown in FIG. 8 as mirror 52 may be replaced with a metal mirror. Since a metal mirror is conductive, in a device with a metal mirror 52, n-type region 2b and tunnel junction 53 may be omitted from the device of FIG. 8. Examples of suitable metals include, for example, silver, gold, aluminum, and rhodium.

The benefits of the use of in-plane active regions in laser structure described above in reference to FIG. 8 may also be applied to edge emitting laser diodes, such as the laser diode illustrated in FIG. 10. In the device of FIG. 10, the epitaxial layers are grown on a growth substrate 60, then the stack is etched to form a ridge structure whose vertical walls provide the waveguide. Parallel mirrors 63 are formed by cleaving or etching the ends of the waveguide to provide a reflecting surface. N-contacts 62 and p-contact 65 complete the structure.

FIGS. 9A and 9B illustrates devices including in-plane active regions and polarization shifting surfaces. The device of FIG. 9A includes a polarization-rotating layer 66. The device of FIG. 9B includes a polarization-randomizing layer 68. The devices shown in FIGS. 9A and 9B are flip chip devices, where an n-type region 2, active region 4, and p-type region 6 are formed on a growth substrate 60. A portion of the p-type region and the active region is etched away to expose a portion of the n-type region, on which an n-contact 62 is deposited. Light is extracted from the device through growth substrate 60.

In a conventional III-nitride device with the crystallographic <0001> axis normal to the crystal surface, the absorption of the III-nitride layers is independent of the polarization of incident light. Consequently, a photon emitted by the active region stands an equal chance of being reabsorbed in the active region regardless of its polarization. Most of the reabsorption takes place because a photon suffers a total internal reflection at the semiconductor-air or semiconductor-growth substrate interface. Such a photon is "guided" through the device and must go through the active region before encountering another chance to escape the device.

In the case of a device including an in-plane active region such as the devices illustrated in FIGS. 9A and 9B, the light emitted from the active region is linearly polarized perpendicular to the <0001> axis. The III-nitride layers in the device preferentially absorb light that is polarized along this same direction. Consequently, the devices illustrated in FIGS. 9A and 9B include a polarization shifting surface, either a polarization rotating layer 66 or a polarization randomizing surface 68, backed by a reflector 67 to reflect light back into the device. Light incident on the shifting surface would experience either a rotation or a randomization of its polarization, reducing the probability that the light will be reabsorbed. An example of a polarization randomizing structure 68 is a roughened scattering surface, either on the surface of the epitaxial structure (such as on the surface of p-type region 6, as illustrated in FIG. 9B) or on the substrate side of the device. The surface may be roughened by selecting growth conditions to favor three dimensional growth or after growth by, for example, etching the surface or mechanically roughening the surface, such as with grinding grit. An example of polarization rotating structure 66 is a birefringent dielectric located between or adjacent to a metal contact and the epitaxial surface (such as adjacent to p-contact 64 and p-type region 6 as illustrated in FIG. 9A) or located on the substrate side of the device. Since III-nitride crystals are also birefringent, the polarization rotating structure 66 must be selected so the sum of all the rotations in polarization as light travels from active region 4, through p-type region 6, to polarization rotating structure 66, and back through p-type region 6, is 90 degrees, in order to reduce the likelihood that the light is absorbed as it passes back through active region 4 toward substrate 60. In the devices illustrated in FIGS. 9A and 9B, p-contact 64 is formed as a plurality of evenly spaced metal lines, or as a grid. The thickness and spacing of p-contact sections 64 is chosen such that there is adequate current spreading in p-type region 6, but the surface of p-type region 6 covered by the polarization shifting structure is maximized. In FIGS. 9A and 9B, in the area of p-type region 6 covered by p-contacts 64, the textured region 68 or birefringent material 66 may have to be removed by etching.

The polarization shifting structures illustrated in FIGS. 9A and 9B may also be used in a thin film device such as the device illustrated in FIG. 2. In such devices, the polarization shifting structure may be disposed between host substrate 10 and p-type region 6.

Having described the invention in detail, those skilled in the art will appreciate that, given the present disclosure, modifications may be made to the invention without departing from the spirit of the inventive concept described herein.

For example, two or more of the features described above may be combined in a single device. Therefore, it is not intended that the scope of the invention be limited to the specific embodiments illustrated and described.

What is being claimed is:

1. A structure comprising:
a first epitaxial structure comprising a first active region sandwiched between a first n-type region and a first p-type region, the first active region configured to emit light having a polarization ratio, defined as $(|I_p-I_s|/(I_p+I_s)) \times 100\%$ where $I_p$ is an intensity of vertically polarized light and $I_s$ is an intensity of horizontally polarized light, of at least 50% when forward biased;
a polarizer disposed in a path of light emitted by the first active region, wherein the polarizer is oriented to transmit light of a polarization of a majority of light emitted by the first active region; and
a second epitaxial structure comprising a second active region sandwiched between a second n-type region and a second p-type region, the second active region configured to emit light having a polarization ratio of at least 50% when forward biased; wherein:
the polarizer comprises a plurality of evenly spaced, parallel metal lines;
the polarizer configured to serve as an electrical contact between the first and second epitaxial structures;
the polarizer is disposed between the first epitaxial structure and the second epitaxial structure; and
the polarizer is oriented to reflect light of a polarization of a majority of light emitted by the second active region.

2. The structure of claim 1 wherein the first active region and the second active region emit light of a same color.

3. The structure of claim 1 wherein the first active region and the second active region emit light of different colors.

* * * * *